United States Patent [19]

Russell

[11] 3,920,482

[45] Nov. 18, 1975

[54] METHOD FOR FORMING A SEMICONDUCTOR STRUCTURE HAVING ISLANDS ISOLATED BY ADJACENT MOATS

[75] Inventor: Lewis K. Russell, San Jose, Calif.

[73] Assignee: Signetics Corporation, Sunnyvale, Calif.

[22] Filed: Mar. 13, 1974

[21] Appl. No.: 450,566

[52] U.S. Cl. .................... 148/1.5; 148/175; 156/3; 357/91

[51] Int. Cl.$^2$ .................................. H01L 21/265

[58] Field of Search ................. 148/1.5, 175; 156/3; 357/91

[56] References Cited

UNITED STATES PATENTS

| | | | |
|---|---|---|---|
| 3,755,001 | 8/1973 | Kooi et al. | 148/1.5 |
| 3,769,109 | 10/1973 | MacRae | 148/175 UX |
| 3,769,562 | 10/1973 | Bean | 148/175 UX |
| 3,796,612 | 3/1974 | Allison | 148/175 |
| 3,826,699 | 7/1974 | Sawazaki et al. | 148/175 |

*Primary Examiner*—L. Dewayne Rutledge
*Assistant Examiner*—J. M. Davis
*Attorney, Agent, or Firm*—Flehr, Hohback, Test, Albritton & Herbert

[57] ABSTRACT

Moat type isolation of semiconductor structures is provided by forming V-shaped grooves in an epitaxial layer formed on a semiconductor substrate and utilizing ion implantation to provide regions of higher impurity concentration at the apex of the groves to prevent field effect transistor or inversion action. In one method, the ion implantation is conducted before the epitaxial layer is grown. In another embodiment of the method, ion implantation is done after the epitaxial layer is formed by using the same mask window used for etching of the V-shaped groove.

3 Claims, 9 Drawing Figures

METHOD FOR FORMING A SEMICONDUCTOR STRUCTURE HAVING ISLANDS ISOLATED BY ADJACENT MOATS

BACKGROUND OF THE INVENTION

The present invention is directed to a method for forming a semiconductor structure having islands isolated by adjacent moats.

As disclosed in U.S. Pat. No. 3,796,612, issued Mar. 12, 1974, entitled "Semiconductor Isolation Method Utilizing an Isotropic Etching and Differential Thermo-Oxidiation" and in a corresponding continuation-in-part application filed Nov. 12, 1973, Ser. No. 414,764 entitled "Semiconductor Structure and Method" both in the name of David F. Allison, where isolation between semiconductor devices either of the NPN bipolar transistor type or MOS is desired. These devices are isolated by islands which are separated from one another by a combination of dielectric isolation in the form of moats and regions of higher conductivity extending downwardly into the underlying semiconductor substrate from the moats. As disclosed and claimed in both the Allison patent and continuation-in-part application, the moats in general have inclined side walls normally inclined along a predetermined crystal plane orientation and a bottom wall which is parallel to the top surface of the semiconductor body. A region of higher conductivity extending downwardly into the semiconductor body for the moats is provided either by diffusion or ion implantation techniques.

While the foregoing improves the density factor of the final integrated circuit as opposed to the more normal diffusion type isolation, and in addition the region of higher conductivity prevents field effect transistor action which has a tendency to circumvent the isolation of the moats or grooves, it is believed that improvement in density and simplification of semiconductor processing can be achieved by improvements in the above techniques.

OBJECTS AND SUMMARY OF THE INVENTION

It is, therefore, an object of the present invention to provide a semiconductor structure having islands isolated by moats and a method for accomplishing the foregoing which provides for improved density and simplified semiconductor processing.

In accordance with the above object, there is provided a method for forming a semiconductor structure comprising the steps of providing a silicon semiconductor substrate of one conductivity type having a surface with a <100> crystal plane orientation. A layer of silicon semiconductor material of an opposite conductivity type is epitaxially deposited on the surface. The top surface is oriented along the <100> crystal plane. An etch resistant mask is formed on the top surface with a plurality of windows. A plurality of V-shaped isolation moats extending downwardly from the top surface are formed by the use of an anisotropic etch and mask. The walls of the V are oriented along a crystal plane different from the <100> plane and undercut the windows of the mask with the apex of the V being located in proximity to the junction between the substrate and the epitaxial layer. Thereafter, by using the windows and causing ion implantation, an impurity of one conductivity type enters, through the windows, into the lower portion of the V-shaped moats and down into the substrate to form isolation regions having an impurity concentration greater than that of the substrate. Oxide layers are formed on the walls of the moats to provide isolated islands of semiconductor material.

An alternative method which forms a similar semiconductor structure comprises providing a silicon semiconductive substrate of one conductivity type and having a surface. An etch resistant mask is formed on the surface of the substrate. By causing ion implantation through windows in the mask an impurity of one conductivity type is buried in the substrate having an impurity concentration greater than that of the substrate. A layer of silicon semiconductor material of an opposite conductivity type and having a top surface is epitaxially deposited on the surface and a etch resistant mask is formed on the top surface of the layer. By use of an etch and the mask a plurality of isolation moats extending downwardly from the top surface to intersect with the buried impurities. An oxide layer on the walls of the moats are formed to provide isolated islands of semiconductor material.

DETAILED DESCRIPTION OF THE PREFERRED EMBODIMENTS

Figures 1, 2, 3, 4, 5, 6, 7, 8, 9:
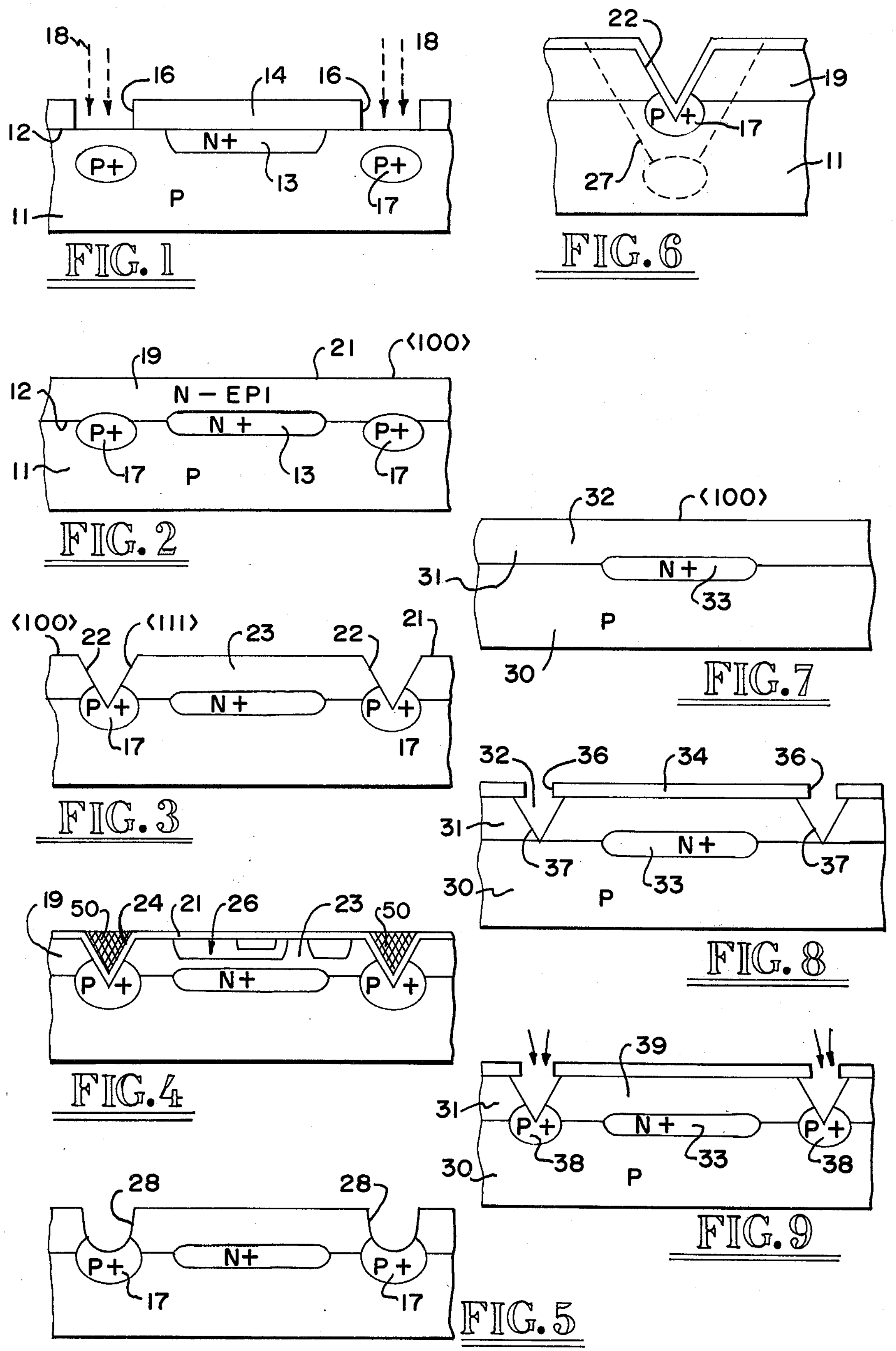
FIGS. 1 through 4 are cross-sectional views showing the steps utilizing in constructing the semiconductor structure incorporating one embodiment of the present invention.
FIG. 5 is a cross-sectional view illustrating an alternative embodiment of the method of FIGS. 1 through 4.
FIG. 6 is a cross-sectional view comparing the above method of the present invention with the prior art.
FIGS. 7, 8 and 9 are cross-sectional views showing the steps utilized in another method of constructing the semiconductor structure incorporating the present invention.

Referring now to FIGS. 1 through 4, a silicon semiconductor substrate 11 of P-type conductivity is provided having a surface 12. Normally such surface would have a <100> orientation. A region 13 of opposite conductivity type, that is, N+, often called a buried layer, is formed by first growing an oxide layer or mask (not shown) on the surface of the semiconductor body 11, opening windows (not shown) in the mask, and diffusing an N impurity therethrough to form the region 13. The function of such buried layer is well-known to those skilled in the art. The N+ buried layer 13 is not essential to the structure and method of the present invention but is shown throughout the figures inasmuch as practical bipolar devices usually include an N+ buried layer.

Thereafter as also illustrated in FIG. 1, a protective or etch resistant layer 14 is formed on the surface 12 of substrate 11 and windows 16 are opened therein by conventional photolithographic and etching techniques. The windows 16 can have any suitable geometry such as, for example, square or circular and are positioned in such a manner that there is sufficient space between the windows to fabricate the devices which are to be utilized in the integrated circuit which is to be formed.

A P-type impurity is deposited as shown by the P+ regions 17 by means of ion implantation as indicated by the arrows 18. That is, boron ions are implanted with a high enough energy to bury the ions in the substrate 11. This is necessary to prevent the auto-doping of the later epitaxial layer when it is grown. The P+ region 17, of course, has an impurity concentration greater than that of the substrate 11.

Protective layer 14 is then cleaned by, for example, hydrochloric acid cleaning but only a minimum amount of substrate material is removed, for example, of the order of 1,000 to 1,500 A in order not to expose the buried P+ regions 17.

Next, an N-type epitaxial layer 19 is grown on the surface 12 which is also of silicon semiconductor material and which is, of course, of an opposite conductivity type to the substrate 11. Epitaxial layer 19 has a top surface 21 and such top surface is in this embodiment of the invention in the <100> crystal plane. As also shown in FIG. 2, the growing of the N epitaxial layer 19 has, of course, caused some expansion of both N+ buried layer 13 and the P+ regions 17 into the epitaxial layer 12. .

In order to form the V-shaped moats 22 as illustrated in FIG. 3, an etch resistant mask (not shown) is formed on the surface 21, windows are cut and by well-known anisotropic etch techniques and V-shaped grooves are formed with their inclined walls in this embodiment lying on the <111> crystal plane. The moats 22 are formed deep enough so that the apex of the V intersects with the P+ regions 17 to provide an isolated island 23. There is finally illustrated in FIG. 4, an oxide layer 24 which is formed on the top surface 21 of layer 19 and on the walls of the V-shaped moats 22.

Thereafter or prior to forming the oxide layers, active transistor devices 26, and associated components are formed in the now isolated island 23. The final structure will have the V-notches filled with polycrystalline silicon 50 to provide a completely planar surface.

FIG. 6 compares the present invention to that of the prior art as represented by the Allison patent and application. It is believed that the density achieved by using a V-shaped grove as discussed above as opposed to the Allison technique as shown by dashed outline 27 provides for a significant improvement in density because of the smaller area used for the moat type isolation.

FIG. 5 illustrates an alternative embodiment of that of FIGS. 1 through 4 where instead of forming a V-type moat with the use of anisotropic etching, an isotropic etch is conducted to provide U-shaped moats 28. The bottom of these moats must also intersect regions 17. While the area required by the U-shaped moats is slightly larger, it may still offer advantages in some instances.

It should also be noted with respect to the use of the V-shaped notch along the <111> crystal plane that in some instances a <110> crystal plane or other crystal plane can be used.

FIGS. 7 through 9 illustrate another embodiment of the invention which provides for improved density in a manner similar to that of the embodiment of FIGS. 1 through 4 or FIG. 5 but also provides simplified processing. As illustrated in FIG. 7, a silicon semiconductor substrate 30 doped with P-type impurities has epitaxially grown on its surface an N-type layer of silicon semiconductive material 31 oriented in the <100> crystal plane. A region 32 of N+ conductivity forms a buried layer 33 in the manner discussed above.

An etch resistant mask 34 is grown on layer 32 as illustrated in FIG. 8 and includes a plurality of windows 36. V-shaped isolation moats 37 are formed in layer 31 by anisotropic etch techniques along a predetermined crystal plane which is different from the <100> crystal plane in such a manner that the windows 36 are undercut. This is also discussed in the above copending Allison application and issued patent. However, in accordance with the present invention, the apex of the Vs are located in proximtiy to the junction between substrate 30 and expitaxial layer 31.

Thereafter, as illustrated in FIG. 9, using the same windows 36, that is the same mask step is utilized, impurities are caused to enter through the windows by ion implantation into the lower portion of the V-shaped moats on a substrate to form the P+ isolation region 38. Thus, a structure similar to that of FIG. 3 is formed by this method. The overhanging portions of the mask produced by the undercut shields the upper portins of the V-grooves from the ion implantation. Thereafter, oxide layers are completed on the walls of the moats and further processing is accomplished to form the active circuit devices in the isolated island 39.

With the foregoing method in addition to achieving a better density by the use of the V-shaped grooves, processing is simplified by using the same mask to form both the V-shaped grooves and in the ion implantation step.

Thus, the present invention has provided an improved method of providing for moat type isolation in a semiconductor structure.

I claim:

1. A method for forming a semiconductor structure comprising the following steps: providing a silicon semiconductive substrate of one conductivity type and having a surface; forming an etch resistant mask on said surface of said substrate; causing by ion implantation through windows in said mask an impurity of said one conductivity type to be buried in said substrate having an impurity concentration greater than that of said substrate; epitaxially depositing on said surface a layer of silicon semiconductor material of an opposite conductivity type and having a top surface; forming an etch resistant mask on said top surface of said layer; forming by use of an etch and the mask a plurality of isolation moats extending downwardly from said top surface to intersect with said buried impurities; and forming an oxide layer on the walls of said moats to provide isolated islands of semiconductor material.

2. A method as in claim 1 where said moats are formed by an anisotropic etch to form V-shaped moats and the apex of the Vs intersect said buried impurities.

3. A method as in claim 1 where said moats are formed by an isotropic etch to form U-shaped moats and the bites of the Us intersect said buried impurities.

* * * * *